(12) United States Patent
Ryzhikov et al.

(10) Patent No.: US 7,859,756 B2
(45) Date of Patent: Dec. 28, 2010

(54) OPTICAL SYSTEM FOR TRANSFORMING NUMERICAL APERTURE

(75) Inventors: Lev Ryzhikov, Norwalk, CT (US); Yuli Vladimirsky, Weston, CT (US)

(73) Assignee: ASML Holding N.V., Veldhoven (NL)

( * ) Notice: Subject to any disclaimer, the term of this patent is extended or adjusted under 35 U.S.C. 154(b) by 0 days.

(21) Appl. No.: 12/413,963

(22) Filed: Mar. 30, 2009

(65) Prior Publication Data

US 2009/0251786 A1    Oct. 8, 2009

Related U.S. Application Data

(63) Continuation of application No. 11/347,282, filed on Feb. 6, 2006, now Pat. No. 7,532,403.

(51) Int. Cl.
*G02B 27/10* (2006.01)

(52) U.S. Cl. ........................ 359/619; 359/620

(58) Field of Classification Search ................... 359/619
See application file for complete search history.

(56) References Cited

U.S. PATENT DOCUMENTS

| | | | |
|---|---|---|---|
| 4,516,832 A | 5/1985 | Jain et al. | |
| 5,229,872 A | 7/1993 | Mumola | |
| 5,296,891 A | 3/1994 | Vogt et al. | |
| 5,500,736 A | 3/1996 | Koitabashi et al. | |
| 5,523,193 A | 6/1996 | Nelson | |
| 5,530,482 A | 6/1996 | Gove et al. | |
| 5,579,147 A | 11/1996 | Mori et al. | |
| 5,677,703 A | 10/1997 | Bhuva et al. | |
| 5,808,797 A | 9/1998 | Bloom et al. | |
| 5,982,553 A | 11/1999 | Bloom et al. | |
| 6,133,986 A * | 10/2000 | Johnson | 355/67 |
| 6,177,980 B1 | 1/2001 | Johnson | |
| 6,687,041 B1 | 2/2004 | Sandstrom | |
| 6,717,736 B1 | 4/2004 | Hill | |
| 6,747,783 B1 | 6/2004 | Sandstrom | |
| 6,775,069 B2 | 8/2004 | Oskotsky et al. | |

(Continued)

FOREIGN PATENT DOCUMENTS

EP    0 097 250 A2    1/1984

(Continued)

OTHER PUBLICATIONS

Non-Final Rejection mailed May 12, 2008 for U.S. Appl. No. 11/347,282, filed Feb. 6, 2006, 8 pgs.

(Continued)

*Primary Examiner*—Jordan M. Scwartz
*Assistant Examiner*—James C Jones
(74) *Attorney, Agent, or Firm*—Sterne, Kessler, Goldstein & Fox P.L.L.C.

(57) ABSTRACT

A system is provided to form illumination light beams having desirable divergence and directivity. For instance, the system can include an optical element and a relay. The optical element can include a pupil defining element. Further, the relay can have a first and second lens array arranged in series and configured to receive the plurality of beams and to re-image the plurality of beams into a corresponding plurality of beams in an image plane. Each of the plurality of corresponding beams can have a numerical aperture less than a numerical aperture of each of the plurality of beams.

19 Claims, 13 Drawing Sheets

U.S. PATENT DOCUMENTS

| | | | |
|---|---|---|---|
| 6,795,169 | B2 | 9/2004 | Tanaka et al. |
| 6,806,897 | B2 | 10/2004 | Kataoka et al. |
| 6,811,953 | B2 | 11/2004 | Hatada et al. |
| 6,813,003 | B2 | 11/2004 | Oskotsky et al. |
| 6,813,058 | B1 | 11/2004 | Sandstrom |
| 7,006,295 | B2 | 2/2006 | Coston et al. |
| 7,079,321 | B2 | 7/2006 | Coston et al. |
| 7,180,577 | B2 * | 2/2007 | Baselmans et al. ............ 355/67 |
| 7,187,399 | B2 | 3/2007 | Noguchi et al. |
| 7,532,403 | B2 | 5/2009 | Ryzhikov et al. |
| 2003/0156269 | A1 | 8/2003 | Komatsuda et al. |
| 2004/0041104 | A1 | 3/2004 | Liebregts et al. |
| 2004/0130561 | A1 | 7/2004 | Jain |
| 2004/0263821 | A1 | 12/2004 | Oskotsky et al. |
| 2005/0007572 | A1 | 1/2005 | George et al. |

FOREIGN PATENT DOCUMENTS

| | | |
|---|---|---|
| EP | 1 521 110 B1 | 4/2005 |
| JP | 59-007360 A | 1/1984 |
| JP | 6-177007 A | 6/1994 |
| WO | WO 98/32054 A1 | 7/1998 |
| WO | WO 98/33096 A1 | 7/1998 |
| WO | WO 98/38597 A2 | 9/1998 |
| WO | WO 98/38597 A3 | 9/1998 |
| WO | WO 01/61411 A1 | 8/2001 |
| WO | WO 02/25373 A2 | 3/2002 |
| WO | WO 03/29875 A2 | 4/2003 |
| WO | WO 2004/010227 A2 | 1/2004 |
| WO | WO 2004/027521 A2 | 4/2004 |
| WO | WO 2005/019900 A1 | 3/2005 |

OTHER PUBLICATIONS

Final Rejection mailed Dec. 9, 2008 for U.S. Appl. No. 11/347,282, filed Feb. 6, 2006, 9 pgs.

Notice of Allowance mailed Mar. 17, 2009 for U.S. Appl. No. 11/347,282, filed Feb. 6, 2006, 7 pgs.

Search Report, dated Jun. 28, 2007, for European Application No. 07 25 0344.4, 8 pgs.

MTL Annual Report: Submicron and Nanometer Structures 2003, pp. 164-217.

Fedor, A., "Binary Optic Diffuser Design," Digital Optics Corp., 11 pages.

Notice of Reasons for Rejection mailed Dec. 1, 2009 for Japanese Patent Application No. 2007-012368, 2 pgs.

Notification of Reasons for Refusal mailed Feb. 12, 2010 for Japanese Patent Application No. 2007-025792, 4 pgs.

* cited by examiner

OPTICAL SYSTEM FOR TRANSFORMING NUMERICAL APERTURE

CROSS REFERENCE TO RELATED APPLICATION

This application is a continuation application of U.S. patent application Ser. No. 11/347,282, filed Feb. 6, 2006, (that issued as U.S. Pat. No. 7,532,403 on May 12, 2009), entitled "Optical System for Transforming Numerical Aperture," which is incorporated herein by reference in its entirety.

BACKGROUND

1. Field of the Invention

The present invention relates to illumination optical systems.

2. Related Art

A lithographic apparatus is a machine that applies a desired pattern onto a substrate or part of a substrate. A lithographic apparatus can be used, for example, in the manufacture of flat panel displays, integrated circuits (ICs) and other devices involving fine structures. In a conventional apparatus, a patterning device, which can be referred to as a mask or a reticle, can be used to generate a circuit pattern corresponding to an individual layer of a flat panel display (or other device). This pattern can be transferred onto all or part of the substrate (e.g., a glass plate), by imaging onto a layer of radiation-sensitive material (e.g., resist) provided on the substrate.

Instead of a circuit pattern, the patterning device can be used to generate other patterns, for example a color filter pattern or a matrix of dots. Instead of a mask, the patterning device can comprise a patterning array that comprises an array of individually controllable elements. The pattern can be changed more quickly and for less cost in such a system compared to a mask-based system.

A flat panel display substrate is typically rectangular in shape. Lithographic apparatus designed to expose a substrate of this type can provide an exposure region that covers a full width of the rectangular substrate, or covers a portion of the width (for example half of the width). The substrate can be scanned underneath the exposure region, while the mask or reticle is synchronously scanned through a beam. In this way, the pattern is transferred to the substrate. If the exposure region covers the full width of the substrate then exposure can be completed with a single scan. If the exposure region covers, for example, half of the width of the substrate, then the substrate can be moved transversely after the first scan, and a further scan is typically performed to expose the remainder of the substrate.

Illumination modes and beam shaping (e.g., field sizes and shapes) are typically generated by utilization of diffractive and/or refractive arrays that form diffractive or refractive beams of radiation. Desired modification of the diffracted or refracted beams produced by the respective diffractive or refractive arrays is achieved using full field non-imaging (e.g., condenser) and imaging (e.g., relay) optical systems.

For lenses or the arrays (e.g., lens arrays), the resolving power depends upon a wavelength of light being used and inversely upon a numerical aperture. The numerical aperture is the product of a refractive index, n, of a medium (e.g., n=1 for air, n=1.5 for immersion fluid, etc.) and a sine of an angle, i, a semi angle of a cone formed by joining objects to a perimeter of the array. The larger the value of numerical aperture, the better the resolving power of the lens or array.

In case of optical systems with high magnification (or demagnification), such as maskless lithography and microscopy, illumination output beams with very low divergence (numerical aperture) are required. This means that: (a) the input beam divergence (pre-numerical aperture) has to be very low (e.g., at least 3-4 times smaller compared with that of the output beam), which is sometimes unachievable, and (b) the feature sizes of the diffractive or refractive arrays have to be large.

In case of high numerical aperture optical systems, such as in immersion lithography tools, illumination output beams with high divergence (numerical aperture) are required. Two main problems in this case are: (a) the feature sizes of the diffractive or refractive arrays have to be very small, which poses manufacturing difficulties when manufacturing these arrays; and (b) the inability of a condenser in the optical system to fulfill both field size and beam divergence requirements simultaneously.

What is needed is an optical system and method, which may be used in an illumination system of a lithography system, that produces desired numerical apertures or divergences of illumination radiation produced by refractive or diffractive arrays.

SUMMARY

In one embodiment of the present invention, there is provided an optical system that includes an optical element and a lens relay. The optical element is configured to receive a beam and to generate a plurality of beams, where the optical element includes a pupil defining element that is positioned to receive a beam from a radiation source and to produce a pupil defined beam. Further, the lens relay includes a first and second lens array arranged in series and configured to receive the plurality of beams and to re-image the plurality of beams onto an image plane into a plurality of corresponding beams. Each of the plurality of corresponding beams can have a numerical aperture less than a numerical aperture of each of the plurality of beams.

In another embodiment of the present invention, there is provided an optical system that includes an optical element, a first lens relay, and a second lens relay. The optical element receives a beam and generates a plurality of beams, where the optical element includes a field defining element to provide a field defined beam. The first lens relay includes a first and second lens array arranged in series and configured to receive the plurality of beams and to re-image the plurality of beams onto an image plane into a plurality of corresponding beams having a numerical aperture less than a numerical aperture of each of the plurality of beams. Further, the second lens relay includes a third and fourth lens arrays arranged in series and configured to receive the field defined beam and to generate another plurality of corresponding beams. Each of the another plurality of corresponding beams can have a numerical aperture less than a numerical aperture of the field defined beam.

In a further embodiment of the present invention, there is provided a system that includes an optical element, a lens relay, and an optical system. The optical element is configured to receive a beam and to generate a plurality, where the optical element comprises a pupil defining element. The lens relay includes a first and second lens array arranged in series and configured to receive the plurality of beams and to re-image the plurality of beams onto an image plane into a plurality of corresponding beams. Each of the plurality of corresponding beams can have a numerical aperture less than a numerical aperture of each of the plurality of beams. Further, the optical system is located after the lens relay and configured to condition the plurality of corresponding beams.

Further embodiments, features, and advantages of the present inventions, as well as the structure and operation of the various embodiments of the present invention, are described in detail below with reference to the accompanying drawings.

BRIEF DESCRIPTION OF THE DRAWINGS/FIGURES

The accompanying drawings, which are incorporated herein and form a part of the specification, illustrate one or more embodiments of the present invention and, together with the description, further serve to explain the principles of the invention and to enable a person skilled in the pertinent art to make and use the invention.

Figure 6:
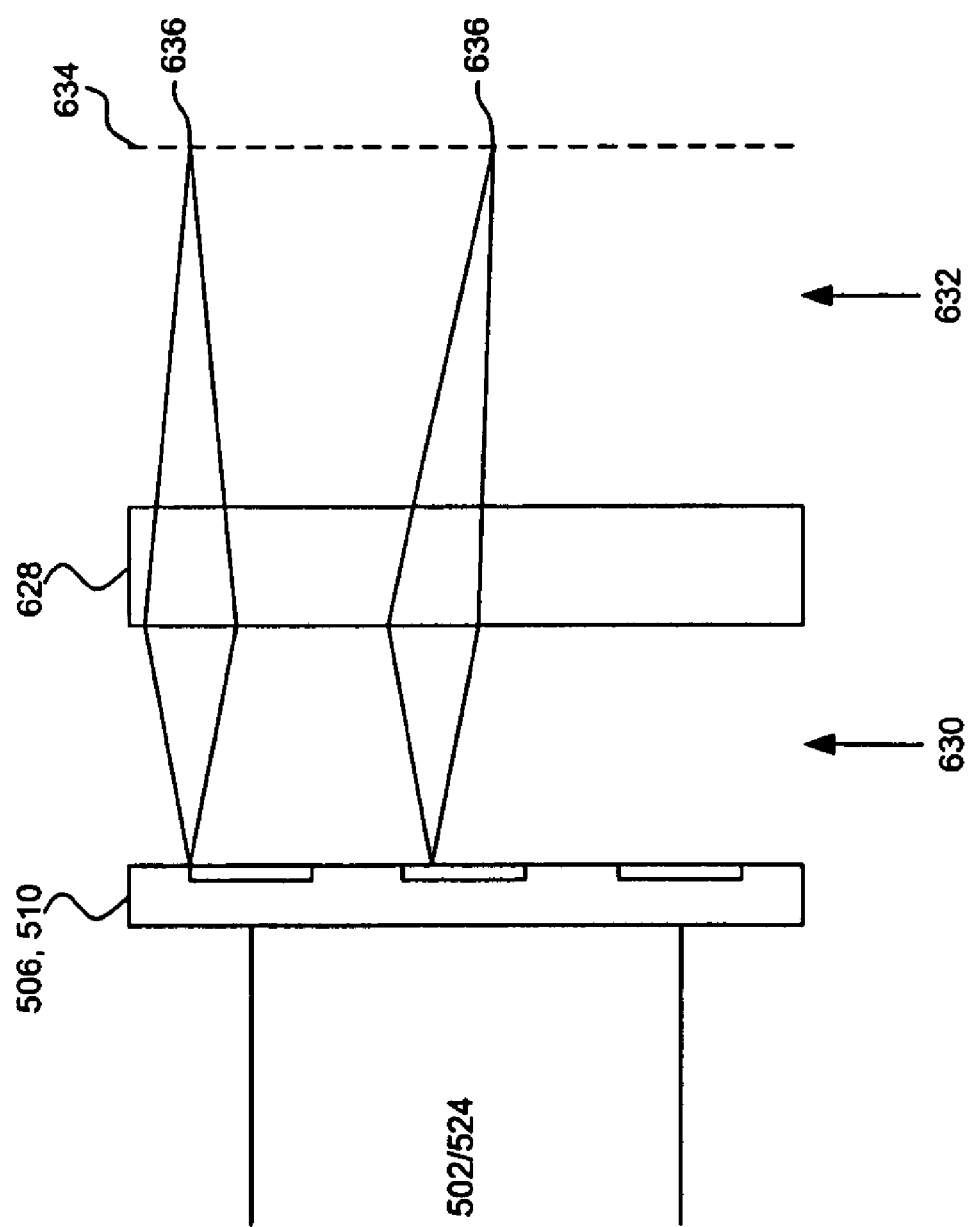
FIG. 6 shows a portion of the illumination system in FIG. 5 including an additional optical element, according to one embodiment of the present invention.
Figure 8:
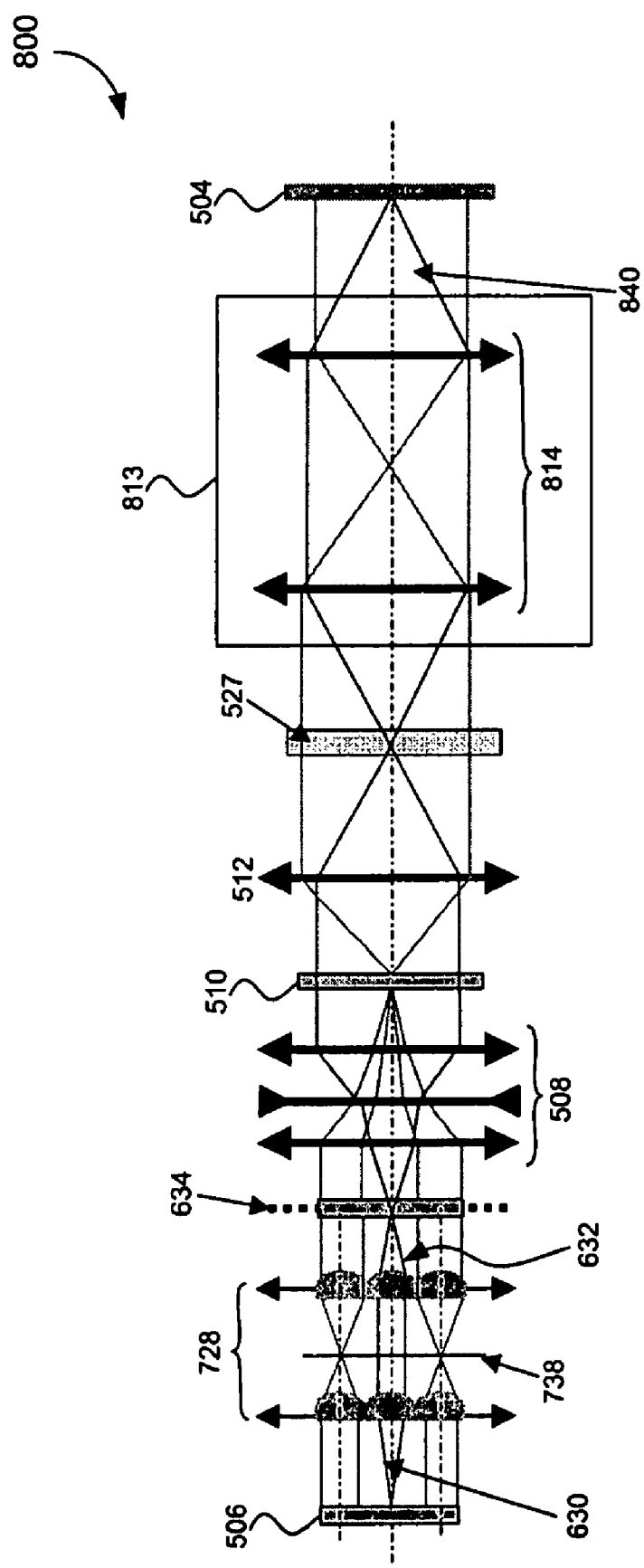
Figure 9:
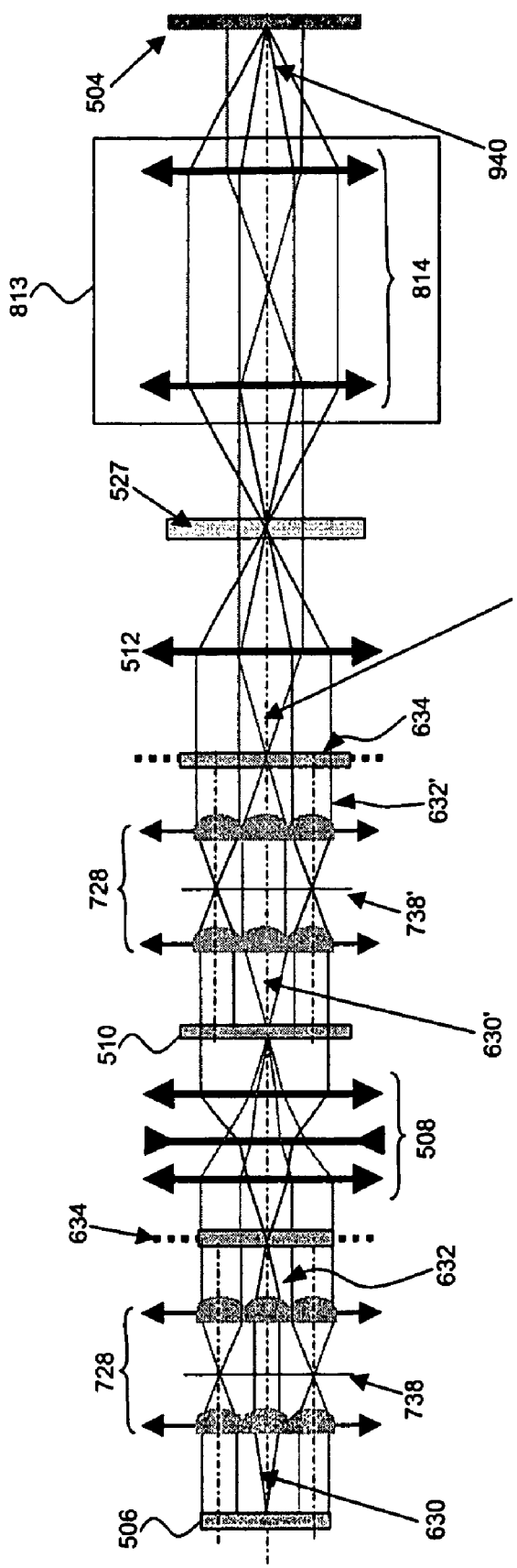
Figure 10:
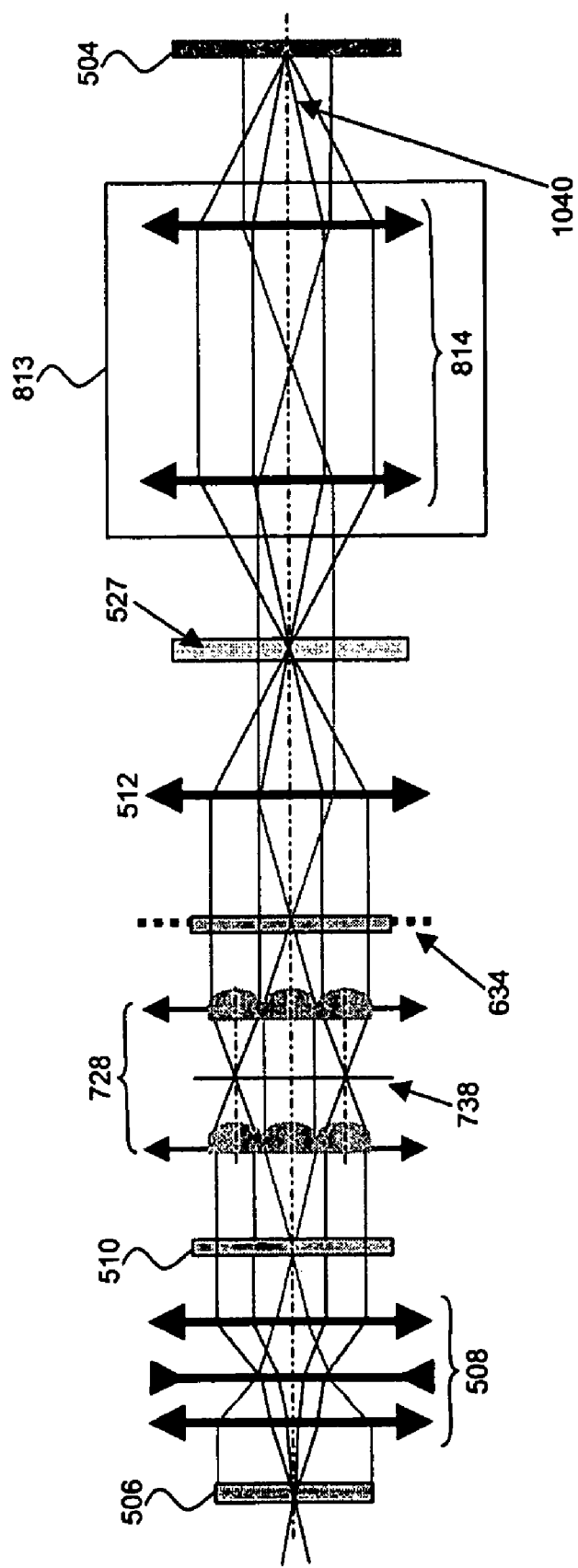

FIGS. 8, 9, and 10 show various illumination systems having one or more of the additional optical element in FIG. 6, according to various embodiments of the present invention.

Figure 11:
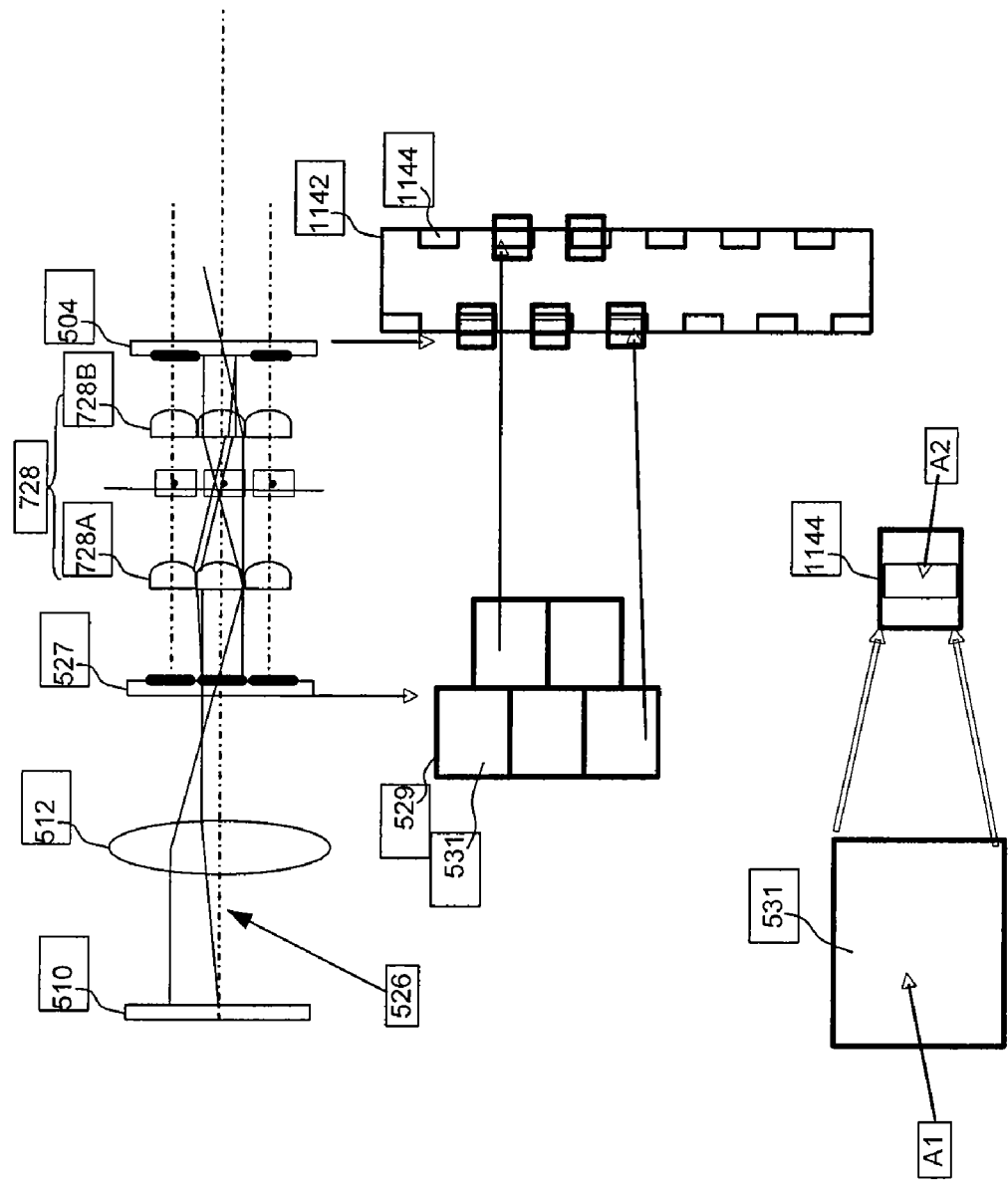

FIG. 11 shows an illumination system, according to one embodiment of the present invention.

Figure 12:
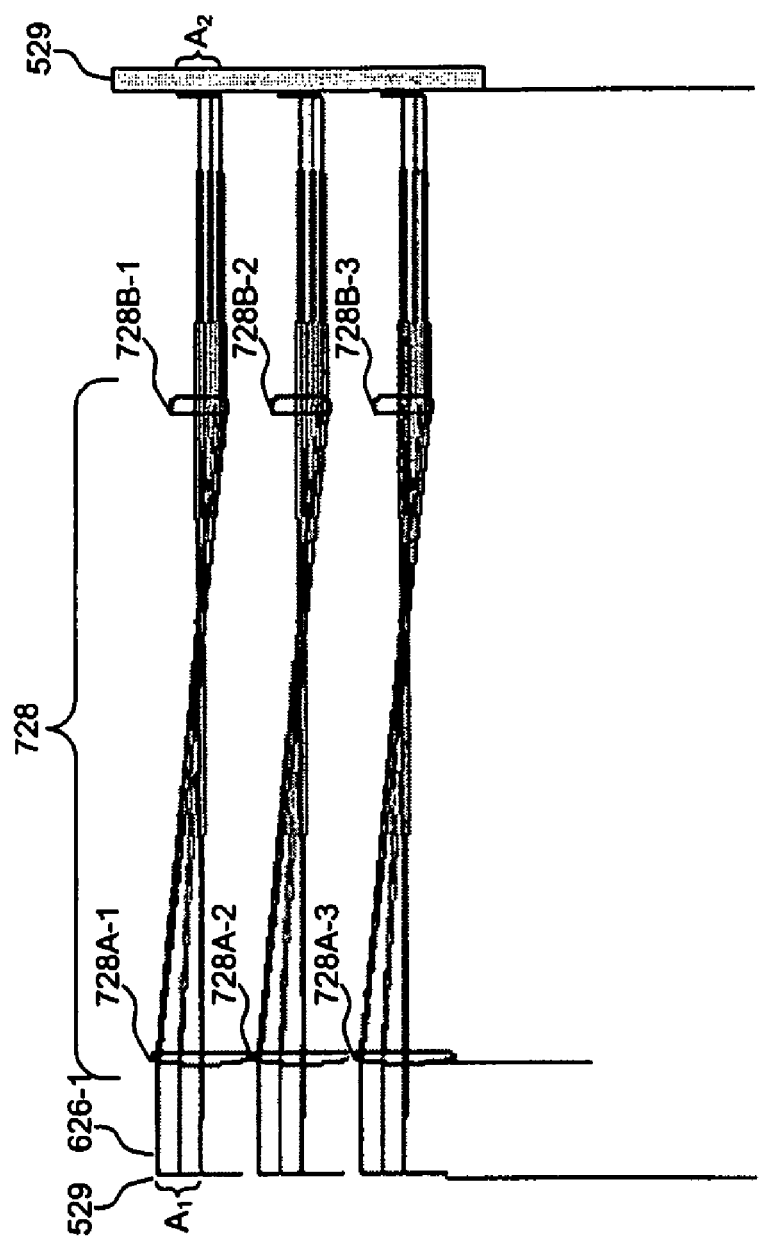

FIG. 12 shows a portion of an illumination system from a field defining element to a patterning device plane, according to one embodiment of the present invention.

Figure 13:
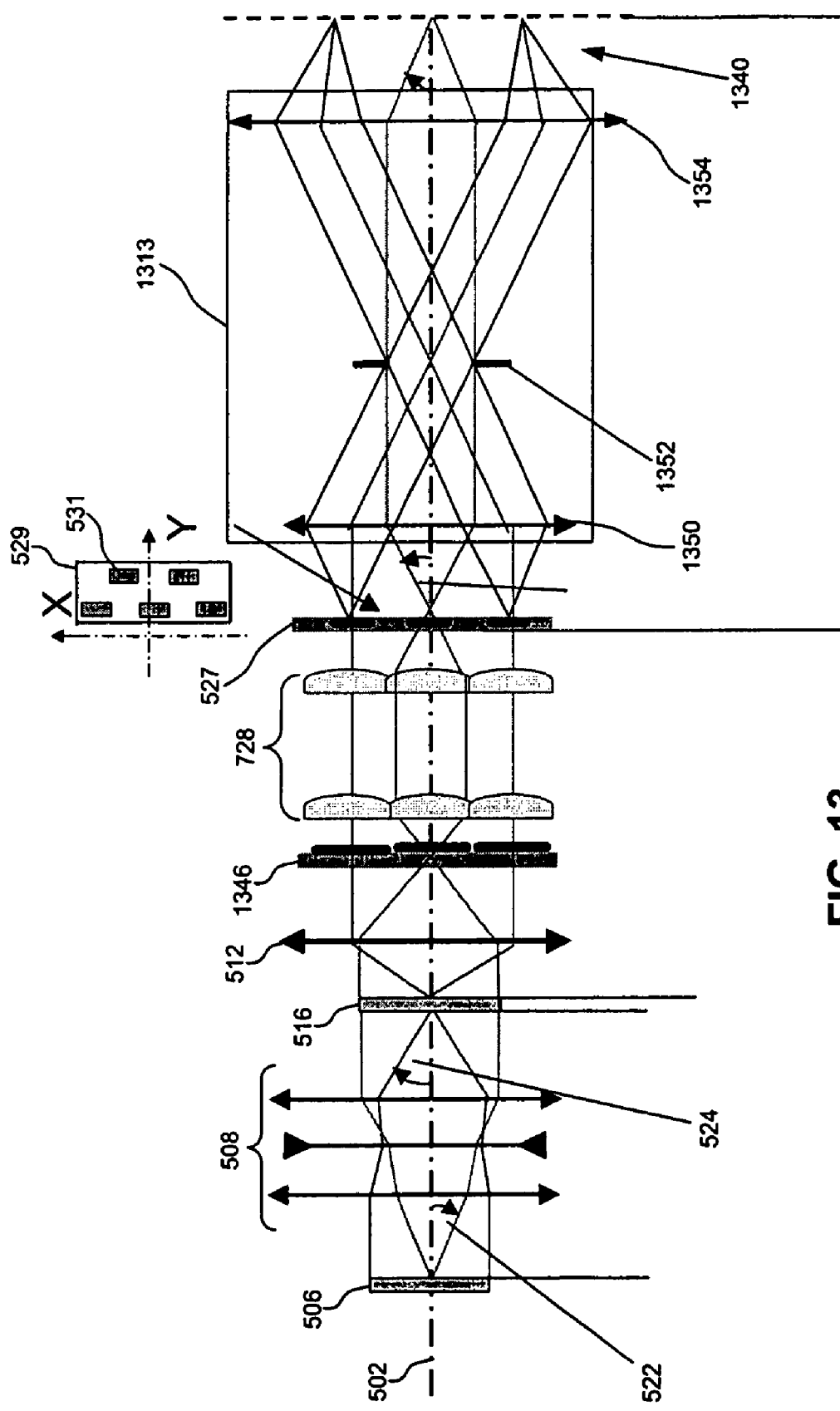

FIG. 13 shows an illumination system, according to one embodiment of the present invention.

One or more embodiments of the present invention will now be described with reference to the accompanying drawings. In the drawings, like reference numbers can indicate identical or functionally similar elements. Additionally, the left-most digit(s) of a reference number can identify the drawing in which the reference number first appears.

DETAILED DESCRIPTION

In one or more embodiments, a system and method are used to form illumination light beams having desirable divergence and directivity. The illumination light beams are shaped using a pupil defining element and a field defining element. Then, divergence or numerical apertures of the light generated by these elements is modified using an optical element that either re-images the light onto planes conjugate to one or both of the pupil defining element and a field defining element, or transforms a numerical aperture of light produced by one or both of the pupil defining element and a field defining element.

While specific configurations and arrangements are discussed, it should be understood that this is done for illustrative purposes only. A person skilled in the pertinent art will recognize that other configurations and arrangements can be used without departing from the spirit and scope of the present invention. It will be apparent to a person skilled in the pertinent art that this invention can also be employed in a variety of other applications.

Figure 1:
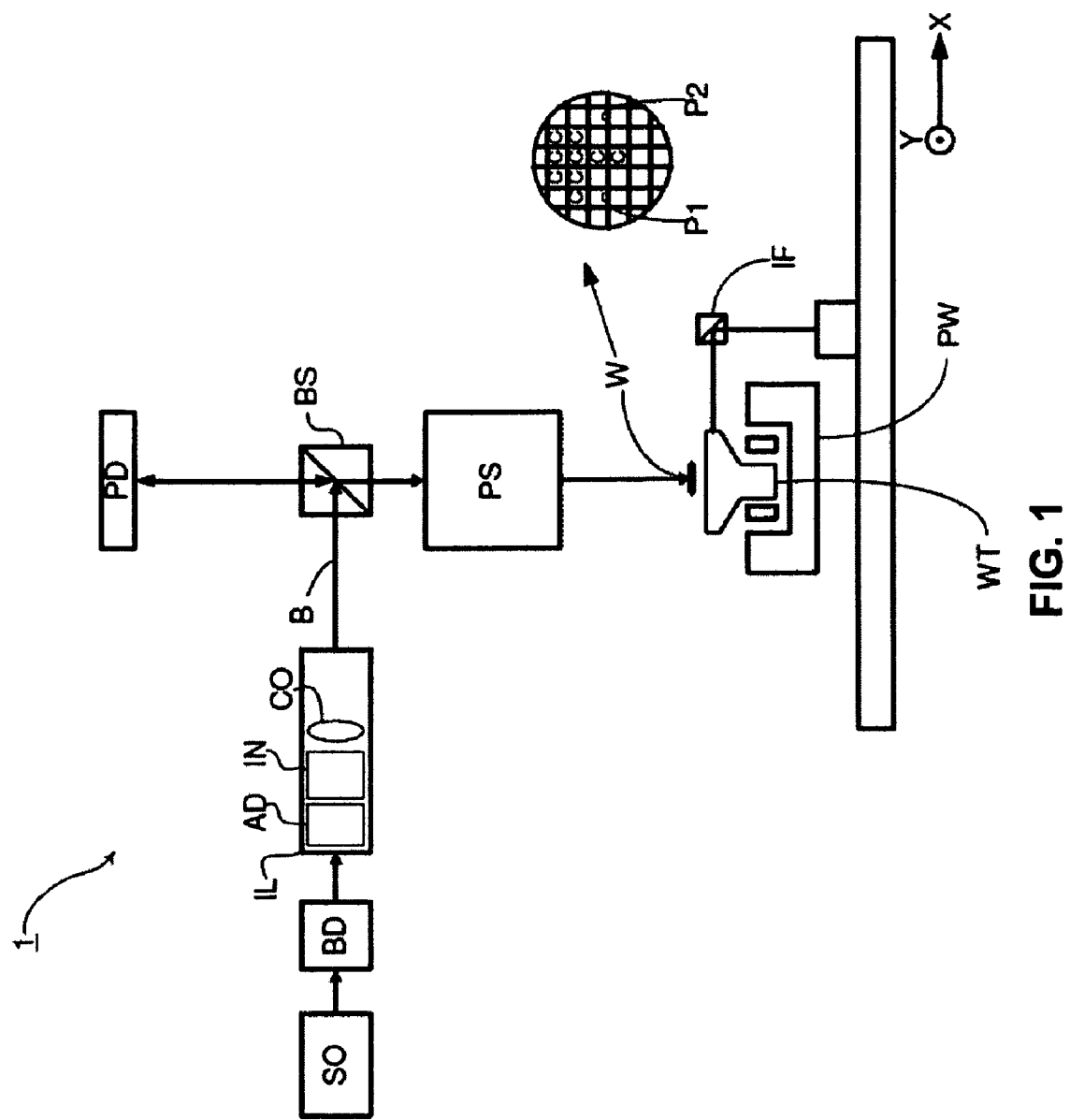
FIGS. 1 and 2 depict lithographic apparatus, according to various embodiments of the present invention.

FIG. 1 schematically depicts the lithographic apparatus of one embodiment of the invention. The apparatus comprises an illumination system IL, a patterning device PD, a substrate table WT, and a projection system PS. The illumination system (illuminator) IL is configured to condition a radiation beam B (e.g., UV radiation).

The patterning device PD (e.g., a reticle or mask or an array of individually controllable elements) modulates the beam. In general, the position of the array of individually controllable elements will be fixed relative to the projection system PS. However, it can instead be connected to a positioner configured to accurately position the array of individually controllable elements in accordance with certain parameters.

The substrate table WT is constructed to support a substrate (e.g., a resist-coated substrate) W and connected to a positioner PW configured to accurately position the substrate in accordance with certain parameters.

The projection system (e.g., a refractive projection lens system) PS is configured to project the beam of radiation modulated by the array of individually controllable elements onto a target portion C (e.g., comprising one or more dies) of the substrate W.

The illumination system can include various types of optical components, such as refractive, reflective, magnetic, electromagnetic, electrostatic or other types of optical components, or any combination thereof, for directing, shaping, or controlling radiation.

The term "patterning device" or "contrast device" used herein should be broadly interpreted as referring to any device that can be used to modulate the cross-section of a radiation beam, such as to create a pattern in a target portion of the substrate. The devices can be either static patterning devices (e.g., masks or reticles) or dynamic (e.g., arrays of programmable elements) patterning devices. For brevity, most of the description will be in terms of a dynamic patterning device, however it is to be appreciated that a static pattern device can also be used without departing from the scope of the present invention.

It should be noted that the pattern imparted to the radiation beam may not exactly correspond to the desired pattern in the target portion of the substrate, for example if the pattern includes phase-shifting features or so called assist features. Similarly, the pattern eventually generated on the substrate may not correspond to the pattern formed at any one instant on the array of individually controllable elements. This can be the case in an arrangement in which the eventual pattern formed on each part of the substrate is built up over a given period of time or a given number of exposures during which the pattern on the array of individually controllable elements and/or the relative position of the substrate changes.

Generally, the pattern created on the target portion of the substrate will correspond to a particular functional layer in a device being created in the target portion, such as an integrated circuit or a flat panel display (e.g., a color filter layer in a flat panel display or a thin film transistor layer in a flat panel display). Examples of such patterning devices include, e.g., reticles, programmable mirror arrays, laser diode arrays, light emitting diode arrays, grating light valves, and LCD arrays.

Patterning devices whose pattern is programmable with the aid of electronic means (e.g., a computer), such as patterning devices comprising a plurality of programmable elements (e.g., all the devices mentioned in the previous sentence except for the reticle), are collectively referred to herein as "contrast devices." In one example, the patterning device comprises at least 10 programmable elements, e.g., at least 100, at least 1000, at least 10000, at least 100000, at least 1000000, or at least 10000000 programmable elements.

A programmable mirror array can comprise a matrix-addressable surface having a viscoelastic control layer and a reflective surface. The basic principle behind such an apparatus is that, e.g., addressed areas of the reflective surface reflect incident light as diffracted light, whereas unaddressed areas reflect incident light as undiffracted light. Using an appropriate spatial filter, the undiffracted light can be filtered out of the reflected beam, leaving only the diffracted light to reach the substrate. In this manner, the beam becomes patterned according to the addressing pattern of the matrix-addressable surface.

It will be appreciated that, as an alternative, the filter can filter out the diffracted light, leaving the undiffracted light to reach the substrate.

An array of diffractive optical MEMS devices (micro-electromechanical system devices) can also be used in a corresponding manner. In one example, a diffractive optical MEMS device is comprised of a plurality of reflective ribbons that can be deformed relative to one another to form a grating that reflects incident light as diffracted light.

A further alternative example of a programmable mirror array employs a matrix arrangement of tiny mirrors, each of which can be individually tilted about an axis by applying a suitable localized electric field, or by employing piezoelectric actuation means. Once again, the mirrors are matrix-addressable, such that addressed mirrors reflect an incoming radiation beam in a different direction to unaddressed mirrors; in this manner, the reflected beam can be patterned according to the addressing pattern of the matrix-addressable mirrors. The required matrix addressing can be performed using suitable electronic means.

Another example PD is a programmable LCD array.

The lithographic apparatus can comprise one or more contrast devices. For example, it can have a plurality of arrays of individually controllable elements, each controlled independently of each other. In such an arrangement, some or all of the arrays of individually controllable elements can have at least one of a common illumination system (or part of an illumination system), a common support structure for the arrays of individually controllable elements, and/or a common projection system (or part of the projection system).

In an example, such as the embodiment depicted in FIG. 1, the substrate W has a substantially circular shape, optionally with a notch and/or a flattened edge along part of its perimeter. In an example, the substrate has a polygonal shape, e.g., a rectangular shape.

In example where the substrate has a substantially circular shape include examples where the substrate has a diameter of at least 25 mm, for instance at least 50 mm, at least 75 mm, at least 100 mm, at least 125 mm, at least 150 mm, at least 175 mm, at least 200 mm, at least 250 mm, or at least 300 mm. In an embodiment, the substrate has a diameter of at most 500 mm, at most 400 mm, at most 350 mm, at most 300 mm, at most 250 mm, at most 200 mm, at most 150 mm, at most 100 mm, or at most 75 mm.

In examples where the substrate is polygonal, e.g., rectangular, include examples where at least one side, e.g., at least 2 sides or at least 3 sides, of the substrate has a length of at least 5 cm, e.g., at least 25 cm, at least 50 cm, at least 100 cm, at least 150 cm, at least 200 cm, or at least 250 cm.

In one example, at least one side of the substrate has a length of at most 1000 cm, e.g., at most 750 cm, at most 500 cm, at most 350 cm, at most 250 cm, at most 150 cm, or at most 75 cm.

In one example, the substrate W is a wafer, for instance a semiconductor wafer. In one example, the wafer material is selected from the group consisting of Si, SiGe, SiGeC, SiC, Ge, GaAs, InP, and InAs. In one example, the wafer is a III/V compound semiconductor wafer. In one example, the wafer is a silicon wafer. In an embodiment, the substrate is a ceramic substrate. In one example, the substrate is a glass substrate. In one example, the substrate is a plastic substrate. In one example, the substrate is transparent (for the naked human eye). In one example, the substrate is colored. In one example, the substrate is absent a color.

The thickness of the substrate can vary and, to an extent, can depend, e.g., on the substrate material and/or the substrate dimensions. In one example, the thickness is at least 50 µm, e.g., at least 100 µm, at least 200 µm, at least 300 µm, at least 400 µm, at least 500 µm, or at least 600 µm. In one example, the thickness of the substrate is at most 5000 µm, e.g., at most 3500 µm, at most 2500 µm, at most 1750 µm, at most 1250 µm, at most 1000 µm, at most 800 µm, at most 600 µm, at most 500 µm, at most 400 µm, or at most 300 µm.

The substrate referred to herein can be processed, before or after exposure, in for example a track (a tool that typically applies a layer of resist to a substrate and develops the exposed resist), a metrology tool, and/or an inspection tool. In one example, a resist layer is provided on the substrate.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein can be considered as synonymous with the more general term "projection system."

The projection system can image the pattern on the array of individually controllable elements, such that the pattern is coherently formed on the substrate. Alternatively, the projection system can image secondary sources for which the elements of the array of individually controllable elements act as shutters. In this respect, the projection system can comprise an array of focusing elements such as a micro lens array (known as an MLA) or a Fresnel lens array, e.g., to form the secondary sources and to image spots onto the substrate. In one example, the array of focusing elements (e.g., MLA) comprises at least 10 focus elements, e.g., at least 100 focus elements, at least 1000 focus elements, at least 10000 focus elements, at least 100000 focus elements, or at least 1000000 focus elements. In one example, the number of individually controllable elements in the patterning device is equal to or greater than the number of focusing elements in the array of focusing elements. In one example, one or more (e.g., 1000 or more, the majority, or about each) of the focusing elements in the array of focusing elements can be optically associated with one or more of the individually controllable elements in the array of individually controllable elements, e.g., with 2 or more of the individually controllable elements in the array of individually controllable elements, such as 3 or more, 5 or more, 10 or more, 20 or more, 25 or more, 35 or more, or 50 or more. In one example, the MLA is movable (e.g., with the use of actuators) at least in the direction to and away from the substrate, e.g., with the use of one or more actuators. Being able to move the MLA to and away from the substrate allows, e.g., for focus adjustment without having to move the substrate.

Figure 2:
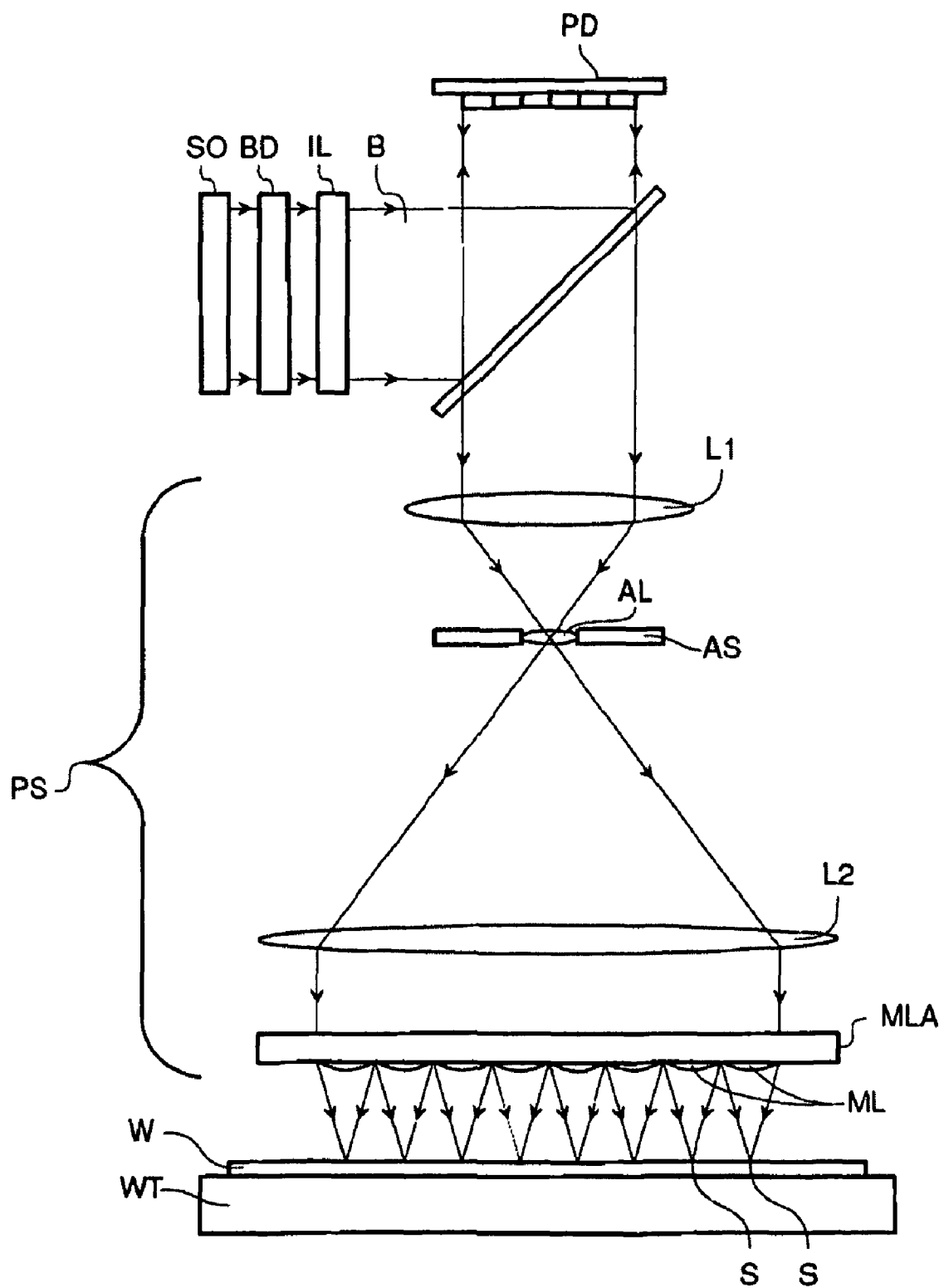

As herein depicted in FIGS. 1 and 2, the apparatus is of a reflective type (e.g., employing a reflective array of individually controllable elements). Alternatively, the apparatus can be of a transmissive type (e.g., employing a transmissive array of individually controllable elements).

The lithographic apparatus can be of a type having two (dual stage) or more substrate tables. In such "multiple stage" machines, the additional tables can be used in parallel, or preparatory steps can be carried out on one or more tables while one or more other tables are being used for exposure.

The lithographic apparatus can also be of a type wherein at least a portion of the substrate can be covered by an "immersion liquid" having a relatively high refractive index, e.g., water, so as to fill a space between the projection system and the substrate. An immersion liquid can also be applied to other spaces in the lithographic apparatus, for example, between the patterning device and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring again to FIG. 1, the illuminator IL receives a radiation beam from a radiation source SO. In one example, the radiation source provides radiation having a wavelength of at least 5 nm, e.g., at least 10 nm, at least 50 nm, at least 100 nm, at least 150 nm, at least 175 nm, at least 200 nm, at least 250 nm, at least 275 nm, at least 300 nm, at least 325 nm, at least 350 nm, or at least 360 nm. In one example, the radiation provided by radiation source SO has a wavelength of at most 450 nm, e.g., at most 425 nm, at most 375 nm, at most 360 nm, at most 325 nm, at most 275 nm, at most 250 nm, at most 225 nm, at most 200 nm, or at most 175 nm. In one example, the radiation has a wavelength including 436 nm, 405 nm, 365 nm, 355 nm, 248 nm, 193 nm, 157 nm, and/or 126 nm. In one example, the radiation includes a wavelength of around 365 nm or around 355 nm. In one example, the radiation includes a broad band of wavelengths, for example encompassing 365, 405, and 436 nm. A 355 nm laser source could be used. The source and the lithographic apparatus can be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source can be an integral part of the lithographic apparatus, for example when the source is a mercury lamp. The source SO and the illuminator IL, together with the beam delivery system BD if required, can be referred to as a radiation system.

The illuminator IL, can comprise an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL can comprise various other components, such as an integrator IN and a condenser CO. The illuminator can be used to condition the radiation beam to have a desired uniformity and intensity distribution in its cross-section. The illuminator IL, or an additional component associated with it, can also be arranged to divide the radiation beam into a plurality of sub-beams that can, for example, each be associated with one or a plurality of the individually controllable elements of the array of individually controllable elements. A two-dimensional diffraction grating can, for example, be used to divide the radiation beam into sub-beams. In the present description, the terms "beam of radiation" and "radiation beam" encompass, but are not limited to, the situation in which the beam is comprised of a plurality of such sub-beams of radiation.

The radiation beam B is incident on the patterning device PD (e.g., an array of individually controllable elements) and is modulated by the patterning device. Having been reflected by the patterning device PD, the radiation beam B passes through the projection system PS, which focuses the beam onto a target portion C of the substrate W. With the aid of the positioner PW and position sensor IF2 (e.g., an interferometric device, linear encoder, capacitive sensor, or the like), the substrate table WT can be moved accurately, e.g., so as to position different target portions C in the path of the radiation beam B. Where used, the positioning means for the array of individually controllable elements can be used to correct accurately the position of the patterning device PD with respect to the path of the beam B, e.g., during a scan.

In one example, movement of the substrate table WT is realized with the aid of a long-stroke module (course positioning) and a short-stroke module (fine positioning), which are not explicitly depicted in FIG. 1. In one example, the apparatus is absent at least a short stroke module for moving substrate table WT. A similar system can also be used to position the array of individually controllable elements. It will be appreciated that the beam B can alternatively/additionally be moveable, while the object table and/or the array of individually controllable elements can have a fixed position to provide the required relative movement. Such an arrangement can assist in limiting the size of the apparatus. As a further alternative, which can, e.g., be applicable in the manufacture of flat panel displays, the position of the substrate table WT and the projection system PS can be fixed and the substrate W can be arranged to be moved relative to the substrate table WT. For example, the substrate table WT can be provided with a system for scanning the substrate W across it at a substantially constant velocity.

As shown in FIG. 1, the beam of radiation B can be directed to the patterning device PD by means of a beam splitter BS configured such that the radiation is initially reflected by the beam splitter and directed to the patterning device PD. It should be realized that the beam of radiation B can also be directed at the patterning device without the use of a beam splitter. In one example, the beam of radiation is directed at the patterning device at an angle between 0 and 90°, e.g., between 5 and 85°, between 15 and 75°, between 25 and 65°, or between 35 and 55° (the embodiment shown in FIG. 1 is at a 90° angle). The patterning device PD modulates the beam of radiation B and reflects it back to the beam splitter BS which transmits the modulated beam to the projection system PS. It will be appreciated, however, that alternative arrangements can be used to direct the beam of radiation B to the patterning device PD and subsequently to the projection system PS. In particular, an arrangement such as is shown in FIG. 1 may not be required if a transmissive patterning device is used.

The depicted apparatus can be used in several modes:

1. In step mode, the array of individually controllable elements and the substrate are kept essentially stationary, while an entire pattern imparted to the radiation beam is projected onto a target portion C at one go (i.e., a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the array of individually controllable elements and the substrate are scanned synchronously while a pattern imparted to the radiation beam is projected onto a target portion C (i.e., a single dynamic exposure). The velocity and direction of the substrate relative to the array of individually controllable elements can be determined by the (de-) magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In pulse mode, the array of individually controllable elements is kept essentially stationary and the entire pattern is projected onto a target portion C of the substrate W using a pulsed radiation source. The substrate table WT is moved with an essentially constant speed such that the beam B is caused to scan a line across the substrate W. The pattern on the array of individually controllable elements is updated as required between pulses of the radiation system and the pulses are timed such that successive target portions C are exposed at the required locations on the substrate W. Consequently, the beam B can scan across the substrate W to expose the complete pattern for a strip of the substrate. The process is repeated until the complete substrate W has been exposed line by line.

4. In continuous scan mode, essentially the same as pulse mode except that the substrate W is scanned relative to the modulated beam of radiation B at a substantially constant speed and the pattern on the array of individually controllable elements is updated as the beam B scans across the substrate W and exposes it. A substantially constant radiation source or a pulsed radiation source, synchronized to the updating of the pattern on the array of individually controllable elements, can be used.

5. In pixel grid imaging mode, which can be performed using the lithographic apparatus of FIG. 2, the pattern formed on substrate W is realized by subsequent exposure of spots formed by a spot generator that are directed onto patterning device PD. The exposed spots have substantially the same shape. On substrate W the spots are printed in substantially a grid. In one example, the spot size is larger than a pitch of a printed pixel grid, but much smaller than the exposure spot grid. By varying intensity of the spots printed, a pattern is realized. In between the exposure flashes the intensity distribution over the spots is varied.

Combinations and/or variations on the above described modes of use or entirely different modes of use can also be employed.

In lithography, a pattern is exposed on a layer of resist on the substrate. The resist is then developed. Subsequently, additional processing steps are performed on the substrate. The effect of these subsequent processing steps on each portion of the substrate depends on the exposure of the resist. In particular, the processes are tuned such that portions of the substrate that receive a radiation dose above a given dose threshold respond differently to portions of the substrate that receive a radiation dose below the dose threshold. For example, in an etching process, areas of the substrate that receive a radiation dose above the threshold are protected from etching by a layer of developed resist. However, in the post-exposure development, the portions of the resist that receive a radiation dose below the threshold are removed and therefore those areas are not protected from etching. Accordingly, a desired pattern can be etched. In particular, the individually controllable elements in the patterning device are set such that the radiation that is transmitted to an area on the substrate within a pattern feature is at a sufficiently high intensity that the area receives a dose of radiation above the dose threshold during the exposure. The remaining areas on the substrate receive a radiation dose below the dose threshold by setting the corresponding individually controllable elements to provide a zero or significantly lower radiation intensity.

In practice, the radiation dose at the edges of a pattern feature does not abruptly change from a given maximum dose to zero dose even if the individually controllable elements are set to provide the maximum radiation intensity on one side of the feature boundary and the minimum radiation intensity on the other side. Instead, due to diffractive effects, the level of the radiation dose drops off across a transition zone. The position of the boundary of the pattern feature ultimately formed by the developed resist is determined by the position at which the received dose drops below the radiation dose threshold. The profile of the drop-off of radiation dose across the transition zone, and hence the precise position of the pattern feature boundary, can be controlled more precisely by setting the individually controllable elements that provide radiation to points on the substrate that are on or near the pattern feature boundary. These can be not only to maximum or minimum intensity levels, but also to intensity levels between the maximum and minimum intensity levels. This is commonly referred to as "grayscaling."

Grayscaling provides greater control of the position of the pattern feature boundaries than is possible in a lithography system in which the radiation intensity provided to the substrate by a given individually controllable element can only be set to two values (e.g., just a maximum value and a minimum value). In an embodiment, at least three different radiation intensity values can be projected onto the substrate, e.g., at least 4 radiation intensity values, at least 8 radiation intensity values, at least 16 radiation intensity values, at least 32 radiation intensity values, at least 64 radiation intensity values, at least 128 radiation intensity values, or at least 256 radiation intensity values.

It should be appreciated that grayscaling can be used for additional or alternative purposes to that described above. For example, the processing of the substrate after the exposure can be tuned, such that there are more than two potential responses of regions of the substrate, dependent on received radiation dose level. For example, a portion of the substrate receiving a radiation dose below a first threshold responds in a first manner; a portion of the substrate receiving a radiation dose above the first threshold but below a second threshold responds in a second manner; and a portion of the substrate receiving a radiation dose above the second threshold responds in a third manner. Accordingly, grayscaling can be used to provide a radiation dose profile across the substrate having more than two desired dose levels. In an embodiment, the radiation dose profile has at least 2 desired dose levels, e.g., at least 3 desired radiation dose levels, at least 4 desired radiation dose levels, at least 6 desired radiation dose levels or at least 8 desired radiation dose levels.

It should further be appreciated that the radiation dose profile can be controlled by methods other than by merely controlling the intensity of the radiation received at each point on the substrate, as described above. For example, the radiation dose received by each point on the substrate can alternatively or additionally be controlled by controlling the duration of the exposure of the point. As a further example, each point on the substrate can potentially receive radiation in a plurality of successive exposures. The radiation dose received by each point can, therefore, be alternatively or additionally controlled by exposing the point using a selected subset of the plurality of successive exposures.

In order to form the required pattern on the substrate, it is necessary to set each of the individually controllable elements in the patterning device to the requisite state at each stage during the exposure process. Therefore, control signals, representing the requisite states, must be transmitted to each of the individually controllable elements. In one example, the lithographic apparatus includes a controller that generates the control signals. The pattern to be formed on the substrate can be provided to the lithographic apparatus in a vector-defined format, such as GDSII. In order to convert the design information into the control signals for each individually controllable element, the controller includes one or more data manipulation devices, each configured to perform a processing step on a data stream that represents the pattern. The data manipulation devices can collectively be referred to as the "datapath."

The data manipulation devices of the datapath can be configured to perform one or more of the following functions: converting vector-based design information into bitmap pattern data; converting bitmap pattern data into a required radiation dose map (e.g., a required radiation dose profile across the substrate); converting a required radiation dose map into required radiation intensity values for each individually controllable element; and converting the required radiation intensity values for each individually controllable element into corresponding control signals.

FIG. 2 depicts an arrangement of the apparatus according to the present invention that can be used, e.g., in the manufacture of flat panel displays. Components corresponding to those shown in FIG. 1 are depicted with the same reference numerals. Also, the above descriptions of the various embodiments, e.g., the various configurations of the substrate, the contrast device, the MLA, the beam of radiation, etc., remain applicable.

FIG. 2 depicts an arrangement of a lithographic apparatus, according to one embodiment of the present invention. This embodiment can be used, e.g., in the manufacture of flat panel displays. Components corresponding to those shown in FIG. 1 are depicted with the same reference numerals. Also, the above descriptions of the various embodiments, e.g., the various configurations of the substrate, the contrast device, the MLA, the beam of radiation, etc., remain applicable.

As shown in FIG. 2, the projection system PS includes a beam expander, which comprises two lenses L1, L2. The first lens L1 is arranged to receive the modulated radiation beam B and focus it through an aperture in an aperture stop AS. A further lens AL can be located in the aperture. The radiation beam B then diverges and is focused by the second lens L2 (e.g., a field lens).

The projection system PS further comprises an array of lenses MLA arranged to receive the expanded modulated radiation B. Different portions of the modulated radiation beam B, corresponding to one or more of the individually controllable elements in the patterning device PD, pass through respective different lenses in the array of lenses MLA. Each lens focuses the respective portion of the modulated radiation beam B to a point which lies on the substrate W. In this way an array of radiation spots S is exposed onto the substrate W. It will be appreciated that, although only eight lenses of the illustrated array of lenses 14 are shown, the array of lenses can comprise many thousands of lenses (the same is true of the array of individually controllable elements used as the patterning device PD).

Figure 3:
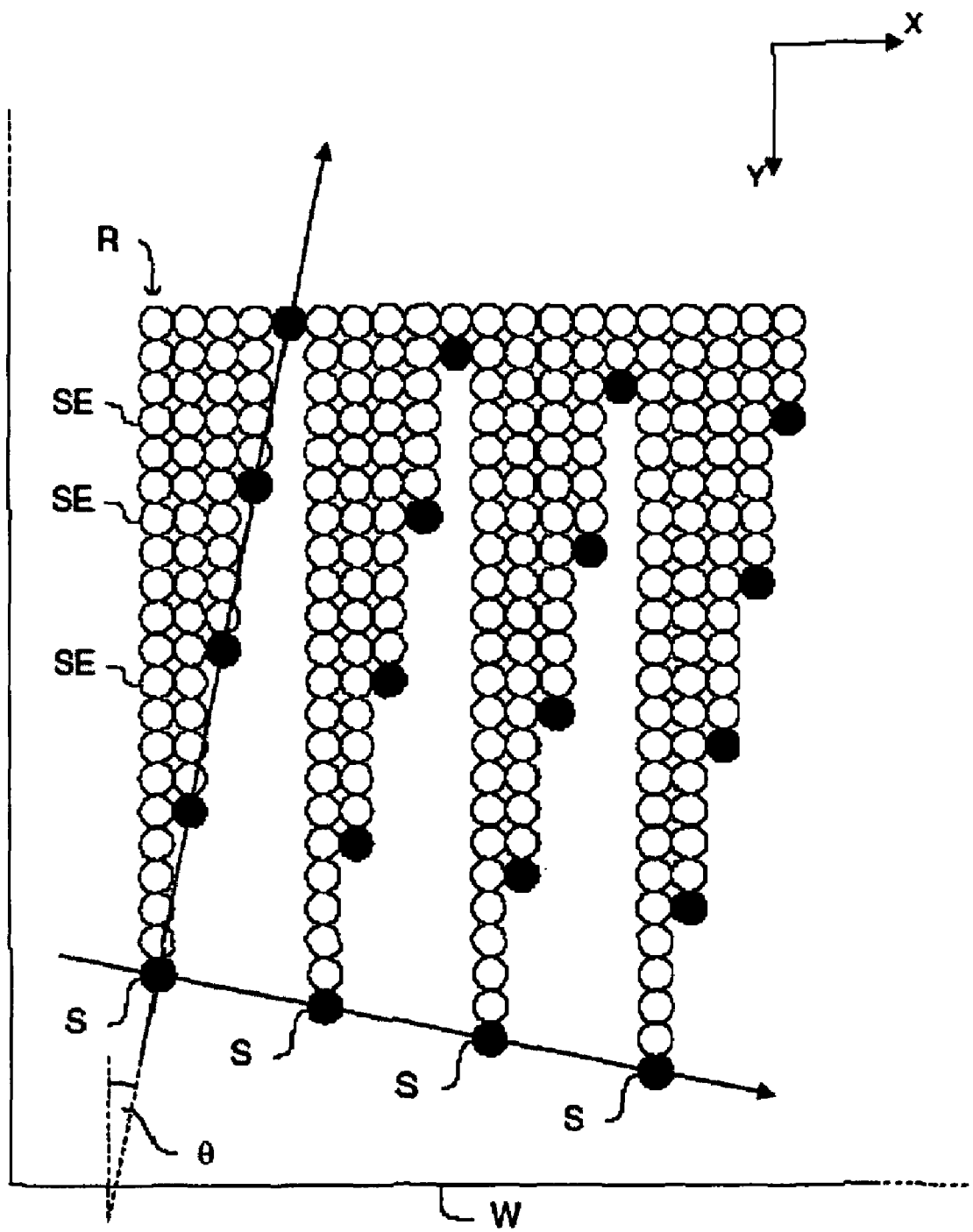
FIG. 3 depicts a mode of transferring a pattern to a substrate according to an embodiment of the invention as show in FIG. 2.

FIG. 3 illustrates schematically how a pattern on a substrate W is generated using the system of FIG. 2, according to one embodiment of the present invention. The filled in circles represent the array of spots S projected onto the substrate W by the array of lenses MLA in the projection system PS. The substrate W is moved relative to the projection system PS in the Y direction as a series of exposures are exposed on the substrate W. The open circles represent spot exposures SE that have previously been exposed on the substrate W. As shown, each spot projected onto the substrate by the array of lenses within the projection system PS exposes a row R of spot exposures on the substrate W. The complete pattern for the substrate is generated by the sum of all the rows R of spot exposures SE exposed by each of the spots S. Such an arrangement is commonly referred to as "pixel grid imaging," discussed above.

It can be seen that the array of radiation spots S is arranged at an angle $\theta$ relative to the substrate W (the edges of the substrate lie parallel to the X and Y directions). This is done so that when the substrate is moved in the scanning direction (the Y-direction), each radiation spot will pass over a different area of the substrate, thereby allowing the entire substrate to be covered by the array of radiation spots 15. In one example, the angle $\theta$ is at most 20°, 10°, e.g., at most 5°, at most 3°, at most 1°, at most 0.5°, at most 0.25°, at most 0.10°, at most 0.05°, or at most 0.01°. In one example, the angle $\theta$ is at least 0.001°.

Figure 4:
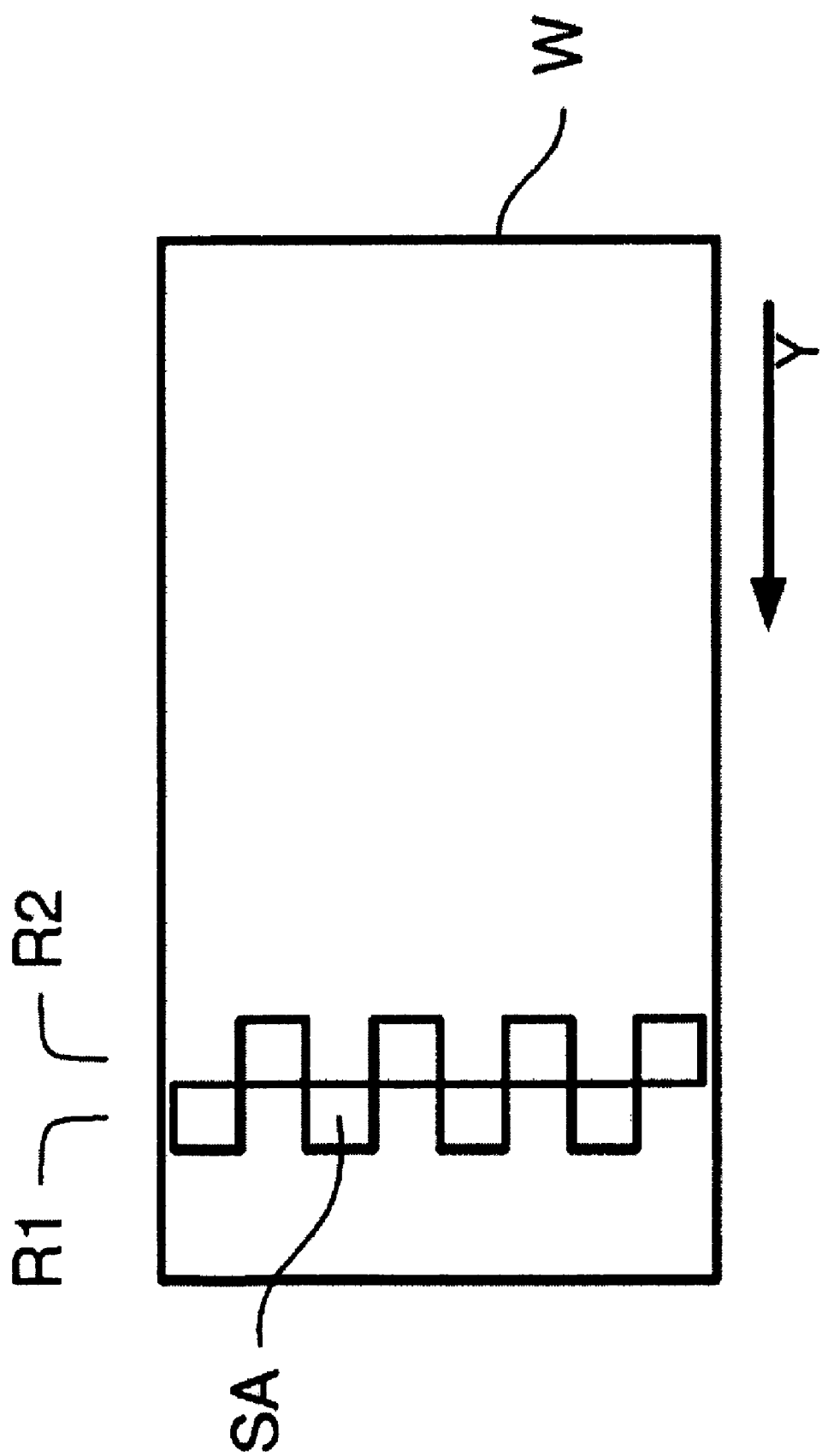
FIG. 4 depicts an arrangement of optical engines, according to one embodiment of the present invention.

FIG. 4 shows schematically how an entire flat panel display substrate W can be exposed in a single scan using a plurality of optical engines, according to one embodiment of the present invention. In the example shown eight arrays SA of radiation spots S are produced by eight optical engines (not shown), arranged in two rows R1, R2 in a "chess board" configuration, such that the edge of one array of radiation spots S slightly overlaps (in the scanning direction Y) with the edge of the adjacent array of radiation spots. In one example, the optical engines are arranged in at least 3 rows, for instance 4 rows or 5 rows. In this way, a band of radiation extends across the width of the substrate W, allowing exposure of the entire substrate to be performed in a single scan. It will be appreciated that any suitable number of optical engines can be used. In one example, the number of optical engines is at least 1, e.g., at least 2, at least 4, at least 8, at least 10, at least 12, at least 14, or at least 17. In one example, the number of optical engines is less than 40, e.g., less than 30 or less than 20.

Each optical engine can comprise a separate illumination system IL, patterning device PD and projection system PS as described above. It is to be appreciated, however, that two or more optical engines can share at least a part of one or more of the illumination system, patterning device and projection system.

Figure 5:
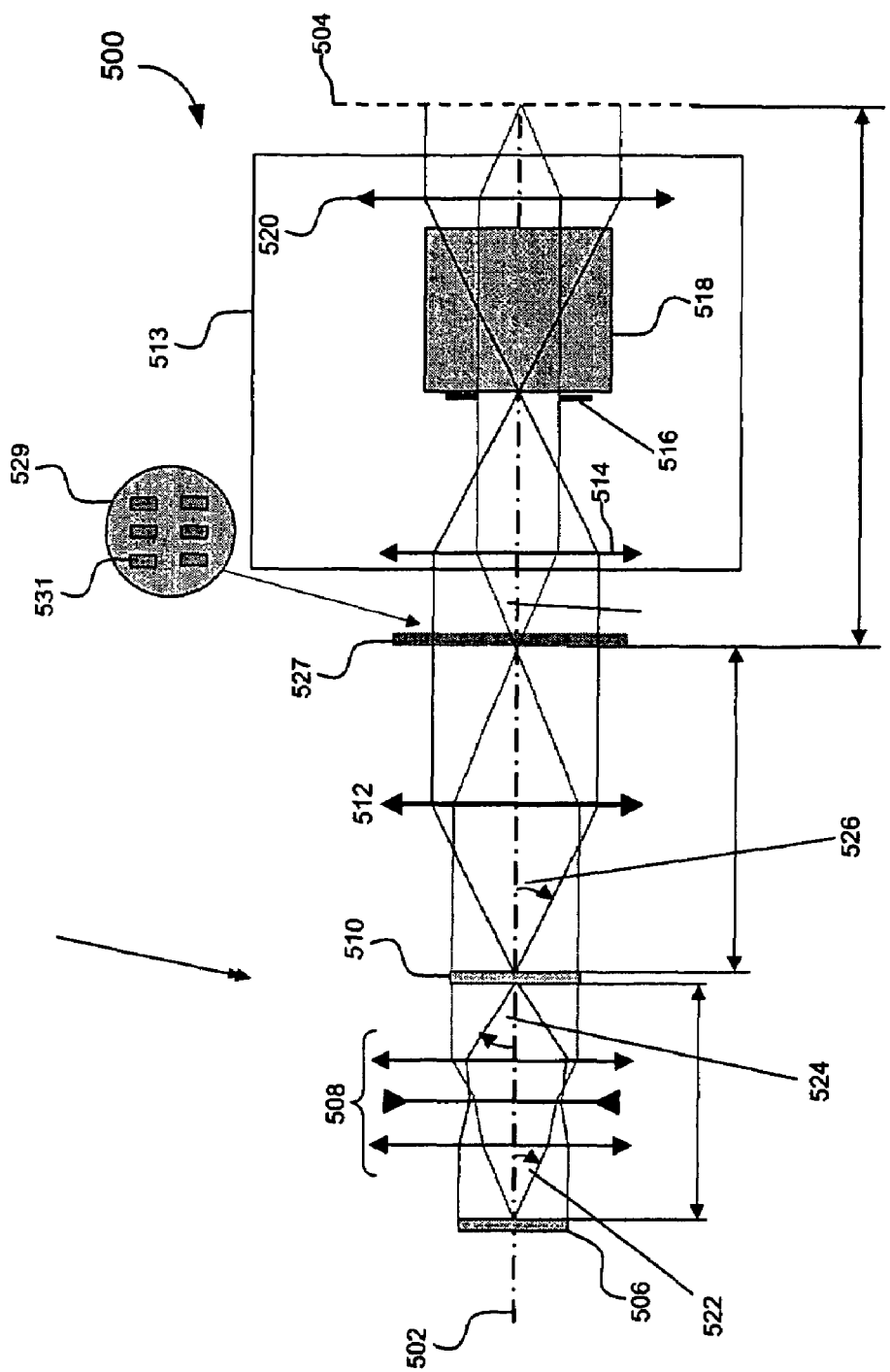
FIG. 5 shows a conventional illumination system.

FIG. 5 shows a conventional illumination system 500. In one example, illumination system 500 can be used in place of illumination system IL. Throughout FIGS. 5, 8, 9, and 10, some lenses (or other optical devices) are represented by arrows. In the convention shown, a double headed arrow with the points facing away from each other is a convex lens, and a double headed arrow with the points facing each other is a concave lens.

Illumination system 500 is used to process an illumination beam 502 to establish a desired pupil and field height for the illumination beam to illuminate a patterning device (not shown) in an object plane 504. Illumination system 500 comprises a pupil defining element 506, a first condenser 508 (e.g., condensing lens or focusing lens), a field defining element 510, a second condenser 512, and an optical system 513 that processes and directs the light onto object plane 504. In one example, optical system 513 includes a relay optical system 514, an aperture 516, a cube 518 (e.g., a beam splitter, a polarizing cube, a polarizing beam splitter, or the like), and a projecting optical system 520 (which is different that a projection system for projecting a patterned beam onto a substrate).

A more detailed description regarding the elements of FIG. 5 can be found, for example, in co-owned U.S. Pat. Nos. 6,813,003 and 6,775,069 and co-owned, co-pending U.S.

application Ser. Nos. 10/896,022, 10/808,436, and 10/812,978, which are all incorporated by reference herein in their entireties.

Light beam 502, which may have a cross-section that is about 12×12 mm, impinges on pupil defining element 506. Pupil defining element 506 can be either a refractive or diffractive optical element that splits beam 502 into a plurality of beams or beamlets 522 that define a pupil and have a first numerical aperture (or divergence, which are interrelated), for example a desirable numerical aperture can be about 0.0025. However, manufacturing a pupil defining element than can produce this desired numerical aperture can be difficult.

Beams 522 are condensed by condenser 508 onto field defining element 510 to form a plurality of beams or beamlets 526. Field defining element 510 can be a refractive or diffractive optical element. The condensed beam 524 can have a desired numerical aperture of about 0.00075 to about 0.0015, which is smaller than the numerical aperture of beams 522. The field defined beams 526 can have a circular numerical aperture of about 0.03165 or a rectangular numerical aperture of about 0.00293 length×0.00033 width.

Beams 526 are directed onto a plane 527 by condenser 512, and then through relay 514, aperture 516, and cube 518, before being projected by projecting optical system 520 onto object plane 504. In one example, plane 527 includes an optical element 529. Optical element 529 can be one of a: multiple aperture cleanup structure, auxiliary multiple aperture forming element, a stencil mask, an intensity correcting multiple aperture element, or the like. In one example, optical element 529 includes one or more fully or partially transmissive areas 531, which can correspond in arrangement and number to active or desired illumination areas on a pattering device (not shown). Each area 531 can have a gradual change in transmissivity across its width or from the center of its width outward in all directions. In one example, optical device 529 can be used to reduce or substantially eliminate undesirable scattered light from reaching the patterning device.

In one example, plane 527 is a patterning device plane, and optical system 513 can be eliminated from system 500. In this example, beams 526 would be directed onto active areas of a pattern device (now shown) by condenser 512, or any other subsequent optical element as might be shown in the embodiments below.

System 500 can produce some inefficiencies in the illumination light based on not being able to accurately control the locations where the various illumination beams 522 and/or 526 will impinge the various subsequent optical elements, i.e., not controlling divergence of beams 522 and/or 526. This is because at least the pupil and field defining optical elements 506 and 510 typically produce beamlets 522 and 526 having divergences or numerical apertures that cause individual beamlets within each beam to overlap, which can result in undesirable illumination. For example, these elements 506 and 510 can function similar to diffusers. In one example, this results because the finer the pitch of a diffractive optical element, the wider the spread of the diffracted beams, i.e., the wider the divergence, which reduces efficiency of resulting illumination or illumination modes.

Illumination beams having small numerical apertures are difficult to produce using diffractive optics. For example, numerical apertures in the range of about $2000^{th}$ of a radian or about ⅛ of a degree. These sized numerical apertures are desired to produce a desired or required size, shape, and divergence of an illumination mode (i.e., type of illumination, e.g., conventional, dipole, quadruple, annular, etc.) of the illumination beam.

In one example, optical elements following diffractive elements 506 and 510 may receive continuous beams. However, some of the subsequent optical elements may have discrete target areas utilized to further process beams 522 and/or 526. This can cause inefficiencies in system 500 and wasted light intensity when only a target area of the subsequent optical element(s) should receive beams 522 and/or 526, but an entire surface receives the beams 522 and/or 526. The subsequent optical elements can also receive beams that do not have desirable numerical apertures because pupil and/or field defining optical elements 506 and 510 are difficult to accurately manufacture, as described above.

When a large numerical aperture is produced from a diffractive optical element, e.g., pupil defining element 506 and/or field defining element 510, output light is a convolution, which causes light loss. The light loss is caused because the numerical aperture of the output light is not structured, but divergent.

What is more desirable is for an illumination system to produce and direct illumination light having a specific divergence or numerical aperture to more efficiently illuminate subsequent optical elements and/or a patterning device. As discussed above, when a numerical aperture is larger, a footprint of the light is sometimes larger than an object being illuminated, while a smaller (narrower) numerical aperture forms a more efficient illumination beam. The following systems shown in FIGS. 6-10 use an optical element (e.g., optical element 628 or optical element 728) that substantially eliminates these inefficiencies.

FIG. 6 shows a portion of illumination system 500 including an optical element 628, according to one embodiment of the present invention. In various examples, optical element 628 can be located after either pupil defining element 506, field defining element 508, or both, as is described in more detail below with respect to FIGS. 8, 9, and 10. Optical element 628 is used to modify a divergence of beams 530, either as a group or separately, which is done by transforming a first numerical aperture of light beams (beamlets) 630 to a desired divergence or a second (desired) numerical aperture of light beams (beamlets) 632. Optical element 628 can also be used to direct discrete or continuous portions of light between pupil defining element 506/field defining element 510 and a conjugate plane 634. Conjugate refers to when planes (or points) are in focus relative to each other, thus here elements 506 and/or 510 are in a plane that is conjugate to plane 634. Generating a desired divergence or numerical aperture for beams 632 allows for desirable uniformity, telecentricity, ellipticity, etc. for the illumination beam. This can be true whether the illumination beam is produced to be patterned in a maskless system, an immersion system, a combination of these systems, or any other lithography system requiring very accurate control of illumination beam parameters.

In one example, element 628 can modify each beamlet within beams 630 to have the same output characteristics. In another example, element 628 can be arranged to modify individual or sets of beamlets within beams 630 to have different output characteristics with respect to each other.

In one example, the first numerical aperture for beams 630 is larger than the second numerical aperture for beams 632. Also, in one example the second numerical aperture can be substantially smaller than what can be produced by using only pupil defining element 506 and/or field defining element 510.

In various examples, this can be done by using optical element 628 to create magnified or demagnified images of the pupil defining element 506/field defining element segments via "channels" formed by elements within optical element 628, as is shown, for example, with respect to at least FIG. 7 below. For example, element 628 can re-image pupil defining element 506/field defining element 510 image on conjugate plane 634, where the re-imaged images contain smaller numerical apertures or divergences.

It is to be appreciated that while smaller numerical apertures or divergences are discussed as being output by optical element 628, in some applications larger numerical apertures or diverges may be desired, and optical element 628 can be used to produce them.

In one example, optical element 628 can be used to form and direct discrete beamlets 632 onto target or "active" areas 636 of image plane 634, and/or other subsequent optical elements (now shown), in order to increase optical efficiency, in some cases by about 250% or more. The increased optical efficiency can be achieved because substantially all of the illumination light is directed only to desired elements, areas, or parts (target areas) of a subsequent plane or subsequent optical element by optical element 628. This, in turn, increases light intensity in each target area by substantially eliminating any of the illumination light from impinging on undesired areas, i.e., areas that do not further process the illumination light.

For example, optical element 628 can produce discrete beams that are directed onto areas 531 of mask 529 (see FIG. 5), and not surrounding areas, in order to substantially decrease light loss through mask 529.

Figure 7:
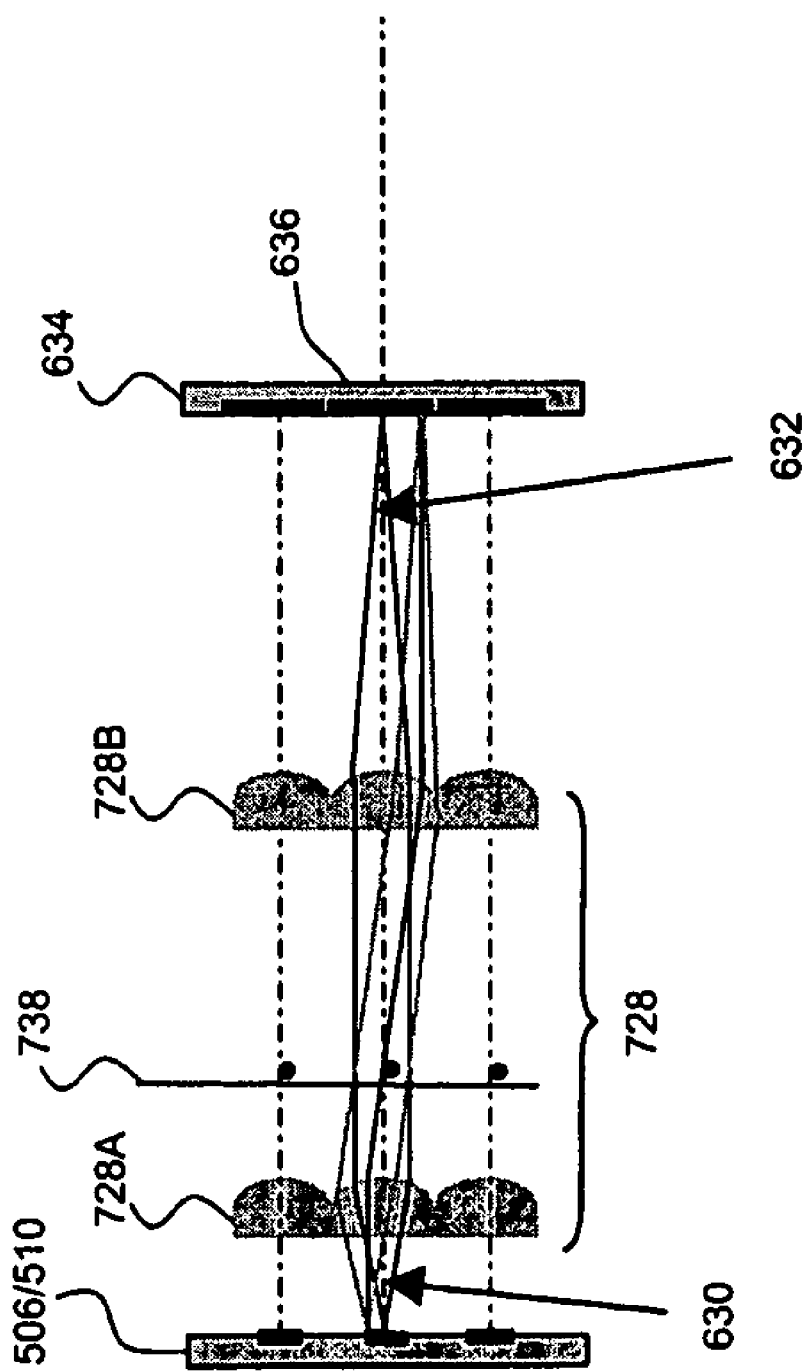
FIG. 7 shows an exemplary optical element for the additional optical element in FIG. 6, according to one embodiment of the present invention.

FIG. 7 shows an exemplary optical element 728, according to one embodiment of the present invention. In this embodiment, optical element 728 is a fly's eye relay 728 including first fly's eye lens 728A and second fly's eye lens 728B. Fly's eye relay 728 is positioned between a diffractive optical element, e.g., pupil defining element 506 or field defining element 510, and a conjugate image plane 634. Between elements 728A and 728B is a focal plane 738 of element 728A. In one example, using Fly's eye relay 728 as the optical element allows for maintaining of double telecentricity in system 500.

Each pair of corresponding lenses (A and B) in the fly's eye relay 728 can be considered its own relay or channel of the fly's eye relay 728.

The inventors are using fly's eye lenses to form images, which is different than their typical use, e.g., to homogenize light. In one example, the inventors have determined that forming fly's eye array 728 allows beams to be separated and remain separated to form individual, discrete images.

In other examples, optical element 628 can be a lenslet, multiple aperture optical device, a multiple aperture array, a multiple lens array (e.g., a microlens array), a single fly's eye lens, or a plurality (relay) of one or more of these elements, so long as the functionality remains the same as described above and below.

FIG. 8 shows an illumination system 800, according to one embodiment of the present invention. System 800 includes most of the elements of system 500 in FIG. 5, but replaces optical system 513 with optical system 813. Optical system 813 includes a two optic relay system 814. System 800 further includes optical element 728. System 800 forms illumination light beams using optical element 728 that impinge on field defining element 510, and other subsequent optical elements, with higher efficiency than light traveling through system 500, as described above. In one example, this produces a desired numerical aperture 840 at object plane 504.

FIG. 9 shows an illumination system 900, according to one embodiment of the present invention. System 900 is similar to illumination system 800, but includes a second optical element 728 that transforms beams 630' having a first numerical aperture to beams 632' having a second numerical aperture. System 900 forms illumination light beams using both optical elements 728 that impinge, respectively, on field defining element 510 and condenser 512, and other subsequent optical elements. This arrangement achieves higher efficiency than light traveling through system 500, and possibly system 800, as described above. In one example, this produces a desired numerical aperture 940 at object plane 504.

FIG. 10 shows an illumination system 1000, according to one embodiment of the present invention. System 1000 includes most of the elements of system 500 in FIG. 5 and system 800 in FIG. 8, and further includes element 728. System 1000 forms illumination light beams using optical element 728 that impinge on condenser 512, and other subsequent optical elements, with higher efficiency than light traveling through system 500, as described above. In one example, this produces a desired numerical aperture 1040 at object plane 504.

FIG. 11 shows a portion of an illumination system 1100 from field defining element 510 to patterning device plane 504, according to one embodiment of the present invention. Illumination system 1100 has fly's eye relay 728 between plane 527 and plane 504. In this system, field defined light beams 526 are directed onto optical element 529 through use of condenser lens 512. An image produced through each area 531 or optical element 529 has its sized reduced through fly's eye relay 728 before reaching active areas 1144 of a pattering device 1142 in plane 504. In one example, an image size A1 (e.g., 16.95×16.93 mm) leaving optical element 529 is reduced to an image size A2 (e.g., 8.57×3.43 mm) at plane 504 through processing of the image by fly's eye relay 728.

FIG. 12 shows an exemplary reduction of beams between field defining element 510 and optical element 529 using fly's eye lens relay 728, according to one embodiment of the present invention. In this embodiment, there is a 50% reduction in an area of a cross-section of beams 626. For example, an area A1 of a first beam 626-1 is reduced by half through fly's eye relay 728 to form an area A2 at optical element 529. This is done in each channel formed through each pair of optical elements 728A-n and 728B-n (n=1, 2, 3, etc.). In this example, a whole field created by field defining element 510 is changed into sub-fields through fly's eye relay 728.

As discussed above, in one example, there can be a different demagnification for each channel based on changing optical characteristics of elements 728A-n and 728B-n in each channel.

FIG. 13 shows an illumination system 1300, according to one embodiment of the present invention. FIG. 13 is similar to FIG. 5, except that it includes fly's eye relay 728 and a diffraction optical element 1346 between condenser 512 and plane 527. Also, in this embodiment optical system 513 is replaced with optical system 1313, which is a single aperture relay. Optical system 1313 includes an aperture 1352 located between two lenses 1350 and 1354. In one example, this produces a desired numerical aperture 1340 at object plane 504.

Although specific reference can be made in this text to the use of lithographic apparatus in the manufacture of a specific device (e.g., an integrated circuit or a flat panel display), it should be understood that the lithographic apparatus described herein can have other applications.

Applications include, but are not limited to, the manufacture of integrated circuits, integrated optical systems, guidance and detection patterns for magnetic domain memories, flat-panel displays, liquid-crystal displays (LCDs), thin-film magnetic heads, micro-electromechanical devices (MEMS), light emitting diodes (LEDs), etc. Also, for instance in a flat panel display, the present apparatus can be used to assist in the creation of a variety of layers, e.g. a thin film transistor layer and/or a color filter layer.

Although specific reference can have been made above to the use of embodiments of the invention in the context of optical lithography, it will be appreciated that the invention can be used in other applications, for example imprint lithography, where the context allows, and is not limited to optical lithography. In imprint lithography a topography in a patterning device defines the pattern created on a substrate. The topography of the patterning device can be pressed into a layer of resist supplied to the substrate whereupon the resist is cured by applying electromagnetic radiation, heat, pressure or a combination thereof. The patterning device is moved out of the resist leaving a pattern in it after the resist is cured.

While specific embodiments of the invention have been described above, it will be appreciated that the invention can be practiced otherwise than as described. For example, the invention can take the form of a computer program containing one or more sequences of machine-readable instructions describing a method as disclosed above, or a data storage medium (e.g., semiconductor memory, magnetic or optical disk) having such a computer program stored therein.

CONCLUSION

While various embodiments of the present invention have been described above, it should be understood that they have been presented by way of example only, and not limitation. It will be apparent to persons skilled in the relevant art that various changes in form and detail can be made therein without departing from the spirit and scope of the invention. Thus, the breadth and scope of the present invention should not be limited by any of the above-described exemplary embodiments, but should be defined only in accordance with the following claims and their equivalents.

It is to be appreciated that the Detailed Description section, and not the Summary and Abstract sections, is intended to be used to interpret the claims. The Summary and Abstract sections can set forth one or more, but not all exemplary embodiments of the present invention as contemplated by the inventor(s), and thus, are not intended to limit the present invention and the appended claims in any way.

What is claimed is:

1. A system comprising:
   an optical element that comprises a pupil defining element configured to receive a beam from a radiation source and to produce a pupil defined beam, including a plurality of beams, therefrom;
   a relay having a first and second lens arrays arranged in series, wherein the first lens array receives the plurality of beams and the second lens array directly receives from the first lens array the plurality of beams that pass through the first lens array and re-images the plurality of beams into a plurality of corresponding beams in an image plane to produce a plurality of corresponding beams; and
   another relay configured to receive and to direct a condensed plurality of beams onto an array of individually controllable elements, wherein the condensed plurality of beams is based on the plurality of corresponding beams.

2. The system of claim 1, wherein the optical element comprises at least one of a diffractive optical element and a refractive optical element.

3. The system of claim 1, wherein the first and second lens arrays comprise fly's eye lenses.

4. The system of claim 1, wherein the first and second lens arrays are configured to maintain a double telecentricity within the system.

5. The system of claim 1, wherein the relay is configured to direct each corresponding beam in the plurality of corresponding beams onto corresponding portions of the another relay.

6. A system comprising:
   an optical element that comprises a field defining element configured to receive a beam and generate a field defined beam, including a plurality of beams, therefrom;
   a first relay having a first and second lens arrays arranged in series and configured to receive the plurality of beams and to re-image the plurality of beams into a plurality of corresponding beams in an image plane, the plurality of corresponding beams having a numerical aperture less than a numerical aperture of each of the plurality of beams; and
   a second relay having a third and fourth lens arrays arranged in series and configured to receive the field defined beam and to generate another plurality of corresponding beams therefrom, each of the another plurality of corresponding beams having a numerical aperture less than a numerical aperture of the field defined beam.

7. The system of claim 6, further comprising:
   a third relay configured to receive and to direct a condensed plurality of beams onto a patterning device, wherein the condensed plurality of beams is based on the another plurality of corresponding beams.

8. The system of claim 7, wherein the patterning device comprises an array of individually controllable elements.

9. The system of claim 6, wherein the optical element comprises at least one of a diffractive optical element and a refractive optical element.

10. The system of claim 6, wherein the first, second, third, and fourth lens arrays comprise fly's eye lenses.

11. The system of claim 6, wherein the first and second lens arrays are configured to maintain a double telecentricity within the system.

12. The system of claim 6, wherein the first lens relay is configured to direct each corresponding beam in the plurality of corresponding beams onto corresponding portions of the image plane.

13. A system comprising:
   an optical element that comprises a pupil defining element configured to receive a beam and to generate a plurality of beams, therefrom;
   a relay having a first and second lens arrays arranged in series, wherein the first lens array receives the plurality of beams and the second lens array directly receives from the first lens array the plurality of beams that pass through the first lens array and re-images the plurality of beams onto an image plane as a plurality of corresponding beams to produce a plurality of corresponding beams;
   another relay configured to receive and to direct a condensed plurality of beams onto an array of individually controllable elements, wherein the condensed plurality of beams is based on the plurality of corresponding beams; and an optical system located after the relay and the another relay and configured to condition the condensed plurality of beams.

14. The system of claim 13, further comprising:
a projection system configured to project a patterned beam from the array of individually controllable elements onto a target portion of a substrate.

15. The system of claim 13, wherein the optical element comprises at least one of a diffractive optical element and a refractive optical element.

16. The system of claim 13, wherein the first and second lens arrays comprise fly's eye lenses.

17. The system of claim 13, wherein the first and second lens arrays are configured to maintain a double telecentricity within the system.

18. The system of claim 13, wherein the relay is configured to direct each corresponding beam in the plurality of corresponding beams onto corresponding portions of the another relay.

19. The system of claim 1, wherein each of the plurality of corresponding beams has a numerical aperture less than a numerical aperture of each of the plurality of beams after the plurality of corresponding beams has passed through the second lens array.

* * * * *